(12) United States Patent
Nakashima

(10) Patent No.: US 12,018,373 B2
(45) Date of Patent: Jun. 25, 2024

(54) SUBSTRATE PROCESSING APPARATUS

(71) Applicant: KOKUSAI ELECTRIC CORPORATION, Tokyo (JP)

(72) Inventor: Seiyo Nakashima, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 518 days.

(21) Appl. No.: 16/812,432

(22) Filed: Mar. 9, 2020

(65) Prior Publication Data
US 2020/0291516 A1 Sep. 17, 2020

(30) Foreign Application Priority Data

Mar. 14, 2019 (JP) ................................ 2019-047056

(51) Int. Cl.
| | |
|---|---|
| *C23C 16/458* | (2006.01) |
| *C23C 16/34* | (2006.01) |
| *C23C 16/44* | (2006.01) |
| *C23C 16/52* | (2006.01) |
| *H01L 21/673* | (2006.01) |
| *H01L 21/677* | (2006.01) |
| *H01L 21/02* | (2006.01) |

(52) U.S. Cl.
CPC ........ *C23C 16/4587* (2013.01); *C23C 16/345* (2013.01); *C23C 16/4408* (2013.01); *C23C 16/4412* (2013.01); *C23C 16/52* (2013.01); *H01L 21/67303* (2013.01); *H01L 21/67772* (2013.01); *H01L 21/67781* (2013.01); *H01L 21/0217* (2013.01); *H01L 21/02271* (2013.01)

(58) Field of Classification Search
CPC ............ C23C 16/4408; C23C 16/4412; H01L 21/67303; H01L 21/6719; H01L 21/67196
See application file for complete search history.

(56) References Cited

U.S. PATENT DOCUMENTS

2010/0229416 A1* 9/2010 Aburatani ......... H01L 21/67757
34/236
2015/0279712 A1* 10/2015 Yachi .................... H01L 21/324
438/795
2018/0148834 A1* 5/2018 Kamimura .......... C23C 16/4584

FOREIGN PATENT DOCUMENTS

WO 2014/050464 A1 4/2014

* cited by examiner

*Primary Examiner* — Parviz Hassanzadeh
*Assistant Examiner* — Nathan K Ford
(74) *Attorney, Agent, or Firm* — Volpe Koenig

(57) ABSTRACT

There is provided a technique that includes: a substrate transfer chamber; a pod transfer chamber; a plurality of reinforcement structures installed along a wall of a housing constituting the substrate transfer chamber and forming a plurality of first confinement spaces between the reinforcement structures and the wall; a communication hole installed at each of the plurality of reinforcement structures so that a space in the housing and each of the plurality of first confinement spaces communicate with each other; a collecting pipe having the plurality of reinforcement structures connected in the housing and including a second confinement space communicating with the plurality of first confinement spaces; and a pressure regulator connected to the collecting pipe, and configured to perform a regulation so that a relationship of pressure is satisfied.

12 Claims, 9 Drawing Sheets

SUBSTRATE PROCESSING APPARATUS

CROSS-REFERENCE TO RELATED APPLICATION

This application is based upon and claims the benefit of priority from Japanese Patent Application No. 2019-047056, filed on Mar. 14, 2019, the entire contents of which are incorporated herein by reference.

TECHNICAL FIELD

The present disclosure relates to a substrate processing apparatus that performs a process such as heat treatment on a substrate such as a semiconductor substrate.

BACKGROUND

In an IC-manufacturing process of a related art, for example, a vertical type processing apparatus which mounts a plurality of substrates on a boat and simultaneously performs batch processing on the plurality of substrates has been used in order to perform heat treatment such as forming an insulating film, a metal film, a semiconductor film or the like on the substrates, or diffusing an impurity.

This vertical type processing apparatus includes a process chamber in which the substrates mounted on the boat are processed, and a substrate transfer chamber for transferring the substrates to the boat before the processing. The substrate transfer chamber is filled with, for example, a nitrogen gas as an inert gas, so that the oxygen concentration in the substrate transfer chamber is lowered to block the substrates from oxygen so as to suppress formation of a natural oxide film on the substrates.

In the conventional vertical type processing apparatus, however, when the oxygen concentration in the substrate transfer chamber is to be reduced, the pressure control of the substrate transfer chamber becomes unstable, which is a problem in improving the throughput of the apparatus.

SUMMARY

The present disclosure provides some embodiments of a technique capable of reducing an oxygen concentration in a housing and realizing stable pressure control of a substrate transfer chamber.

According to one or more embodiments of the present disclosure, there is provided a technique that includes: a substrate transfer chamber; a pod transfer chamber; a plurality of reinforcement structures installed along a wall of a housing constituting the substrate transfer chamber and forming a plurality of first confinement spaces between the reinforcement structures and the wall; a communication hole installed at each of the plurality of reinforcement structures so that a space in the housing and each of the plurality of first confinement spaces communicate with each other; a collecting pipe having the plurality of reinforcement structures connected in the housing and including a second confinement space communicating with the plurality of first confinement spaces; and a pressure regulator connected to the collecting pipe, and configured to perform a regulation so that a relationship of pressure is satisfied.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiments

Figure 1:
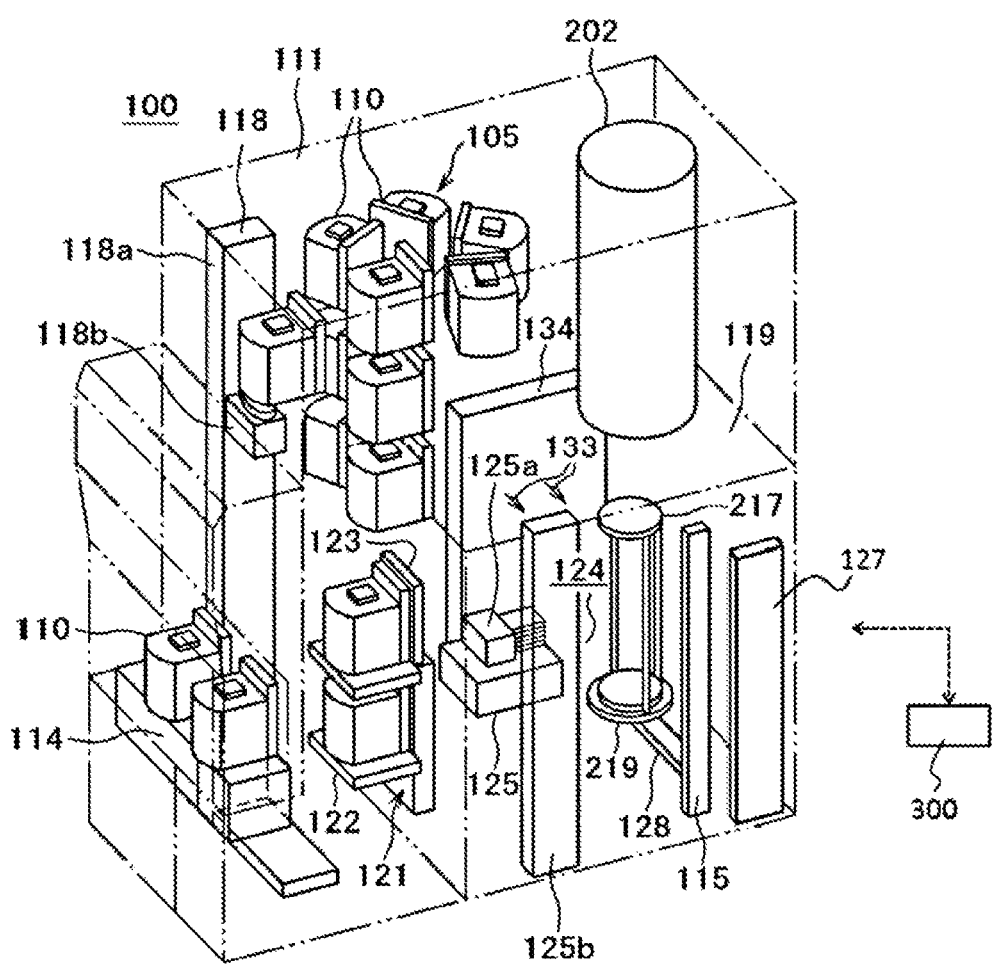
FIG. 1 is a perspective view of a substrate processing apparatus.
Figure 2:
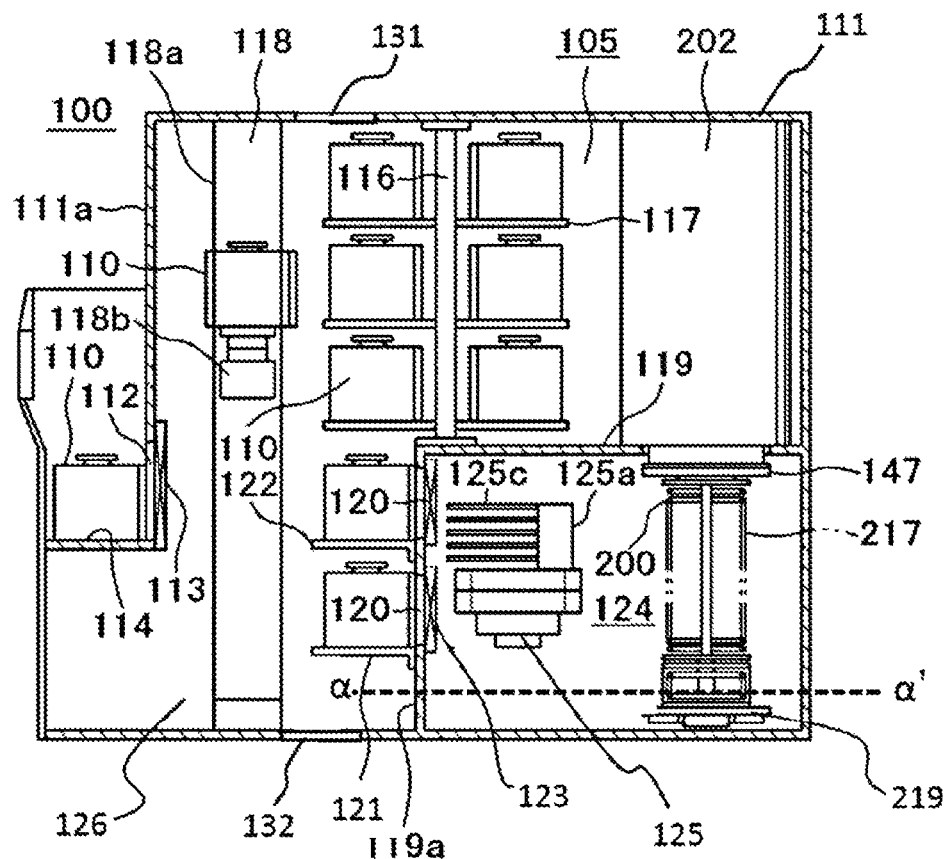
FIG. 2 is a vertical cross sectional view of the substrate processing apparatus.
Figure 8:
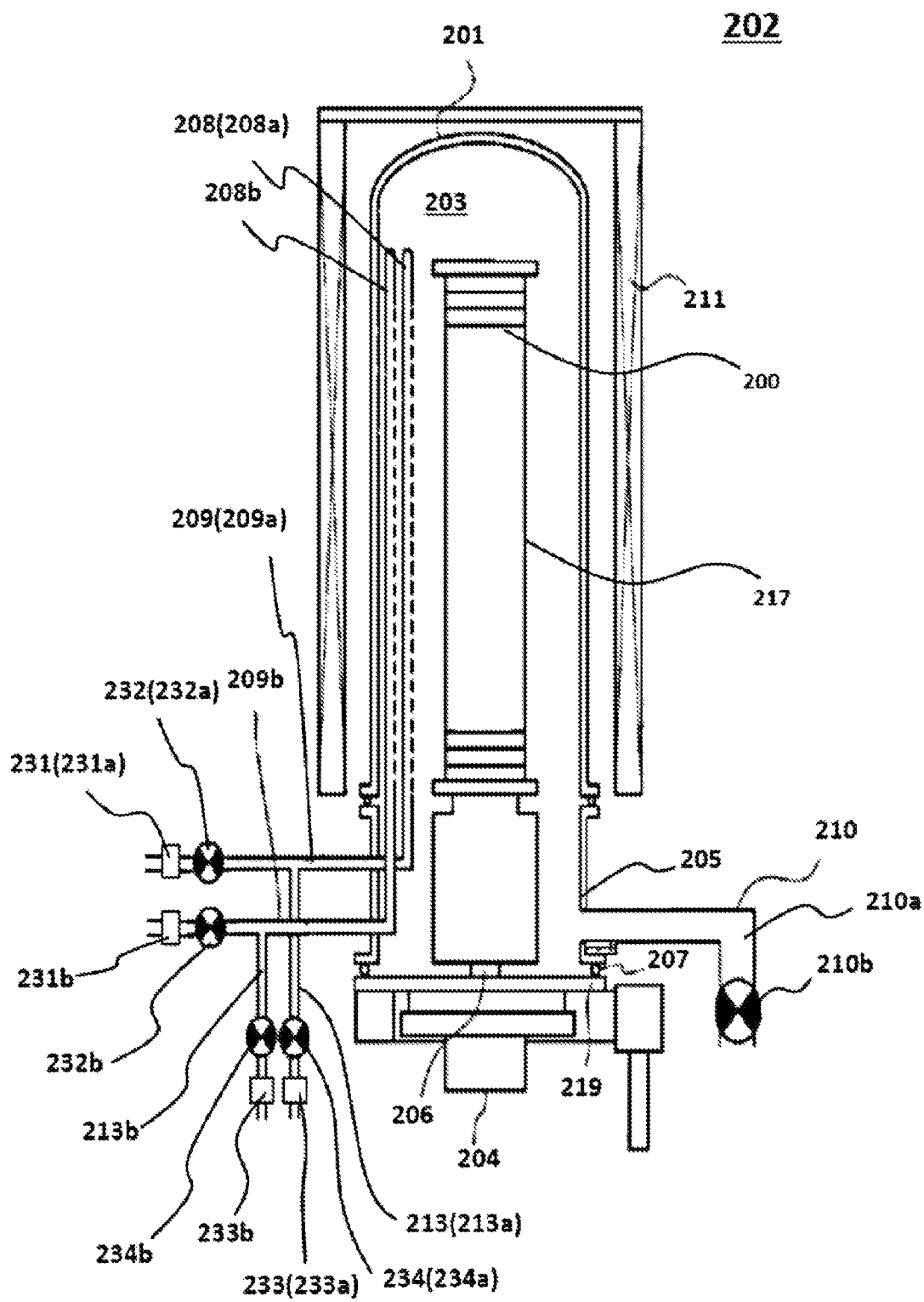
FIG. 8 is a view illustrating a process furnace.
Figure 9:
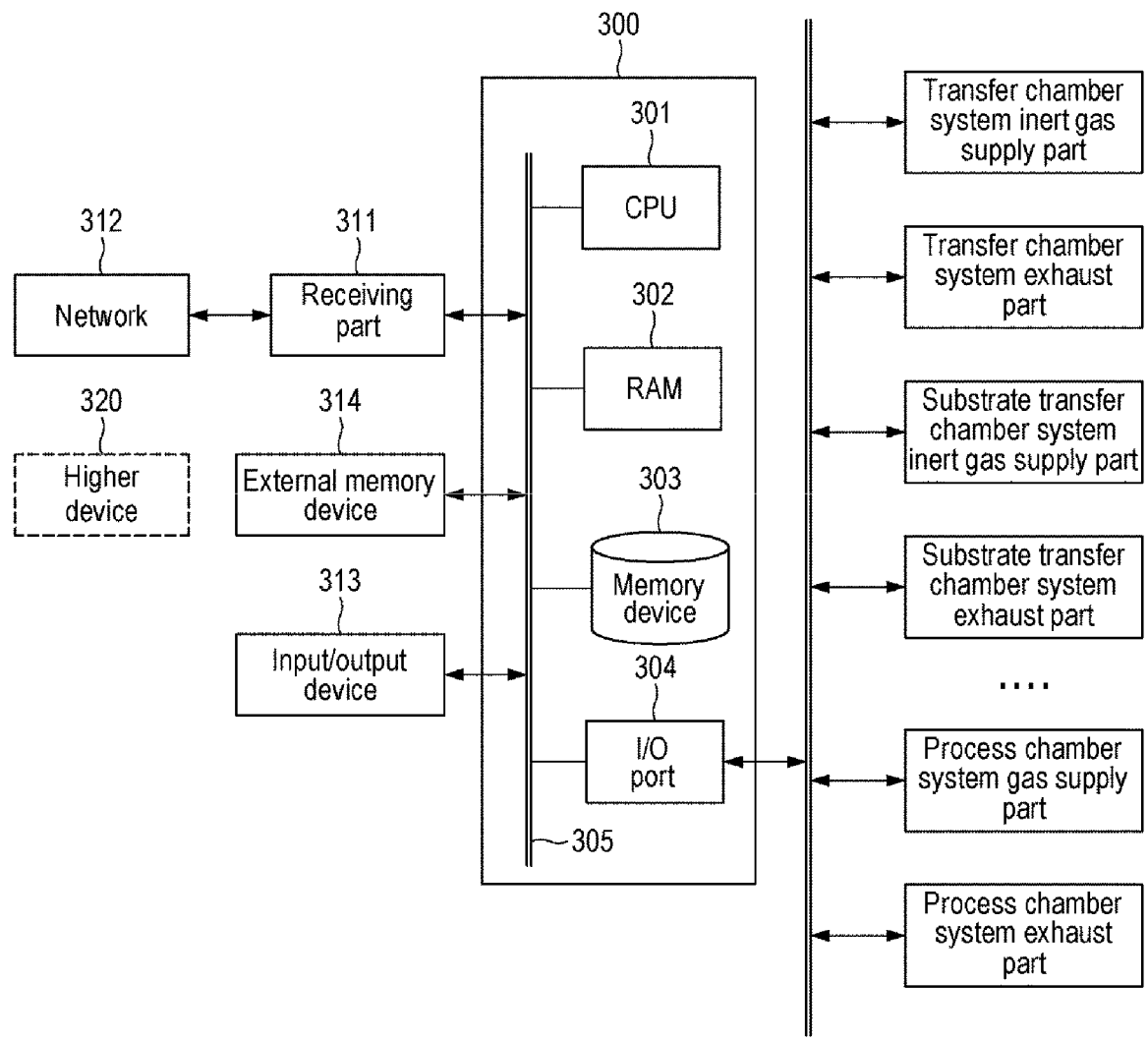
FIG. 9 is a diagram illustrating a controller.

A substrate processing apparatus according to first embodiments of the present disclosure will be described with reference to the drawings. In the present embodiments, the substrate processing apparatus is configured as, for example, a semiconductor manufacturing apparatus that performs a process in a method of manufacturing a semiconductor device (integrated circuit: IC). FIG. 1 is a perspective view of the processing apparatus. FIG. 2 is a side perspective view of the processing apparatus illustrated in FIG. 1. FIGS. 3 to 7 are explanatory views illustrating details of a reinforcement structure of a substrate transfer chamber. FIG. 8 is an explanatory diagram illustrating a controller that controls the substrate processing apparatus. FIG. 9 is an explanatory view illustrating details of a process furnace 202.

A substrate processing apparatus 100 uses pods 110 as substrate carriers which store substrates 200 made of silicon or the like, and includes a housing 111. A pod-loading/unloading port 112 is installed at a front wall 111a of the housing 111 so as to communicate between the inside and the outside of the housing 111, and is opened and closed by a front shutter 113. A load port 114 is installed at a front side of the pod-loading/unloading port 112, in which the pods 110 are held on the load port 114. The pods 110 are loaded onto the load port 114 by an in-process transfer device (not shown), and are unloaded from the load port 114.

A rotary shelf 105 is installed above a substantially central portion of the housing 111 in a longitudinal direction, in which the rotary shelf 105 rotates about a post 116 and stores a plurality of pods 110 in a shelf board 117.

A pod transfer device 118 is installed between the load port 114 and the rotary shelf 105 in the housing 111. The pod transfer device 118 includes a pod elevator 118a which can move up and down while holding the pods 110 and a pod transfer mechanism 118b as a horizontal transfer mechanism, and transfers the pods 110 among the load port 114, the rotary shelf 105, and pod openers 121. A room in which the pod transfer device 118 is disposed will be referred to as a pod transfer chamber 126.

A clean air unit 131 is installed at the ceiling of the housing 111. Clean air as a purified inert gas is supplied from the clean air unit 131 to suppress the diffusion of dust in the housing 111. An exhaust part 132 is installed at the bottom of the housing 111. The exhaust part 132 will also be referred to as a transfer chamber system exhaust part. The inert gas supplied from the clean air unit 131 and the atmosphere in a confinement space as described hereinbelow are exhausted.

A sub-housing 119 is established below a substantially central portion of the housing 111 in the longitudinal direction over its rear end. A pair of substrate-loading/unloading ports 120 for loading and unloading the substrates 200 into and from the sub-housing 119 are installed at a front wall 119a of the sub-housing 119 to be vertically arranged in upper and lower two stages, and a pair of pod openers 121 are respectively installed at the upper and lower substrate-loading/unloading ports 120.

The pod openers 121 each include a mounting table 122 on which the pod 110 is held, and a cap-attaching/detaching mechanism 123 for attaching and detaching a cap (lid) of the pod 110. The pod opener 121 is configured to open and close a substrate-loading/unloading port of the pod 110 by attaching and detaching the cap of the pod 110 held on the mounting table 122 by the cap-attaching/detaching mechanism 123. The mounting table 122 is a transfer shelf on which a substrate accommodator is held when the substrates are transferred.

As illustrated in FIG. 1, the sub-housing 119 constitutes a substrate transfer chamber 124 isolated from the atmosphere in a space in which the pod transfer device 118 and the rotary shelf 105 are installed. A substrate transfer mechanism 125 which transfers the substrates stored in the pods 110 to a boat 217 as a substrate support is installed in a front region in the substrate transfer chamber 124. The substrate transfer mechanism 125 constitutes a substrate transfer device as a substrate transfer means. The substrate transfer mechanism 125 includes a substrate transfer device 125a configured to rotate or linearly drive the substrates 200 in the horizontal direction by mounting them on tweezers 125c, and a substrate transfer device elevator 125b for moving the substrate transfer device 125a up and down. By the continuous operation of the substrate transfer device elevator 125b and the substrate transfer device 125a, the substrates 200 are charged and discharged on and from the boat 217.

A clean unit 134 formed of a supply fan and a dustproof filter is installed in the substrate transfer chamber 124 so as to supply clean air 133 which is a cleaned inert gas. The clean unit 134 will also be referred to as an inert gas supply part or a substrate transfer chamber system inert gas supply part.

The clean unit 134 constitutes an inert gas supply part for supplying an inert gas to the substrate transfer chamber 124. In addition, an exhaust part 127 configured to exhaust an internal atmosphere of the substrate transfer chamber 124 to the outside of the substrate transfer chamber 124 is installed at the substrate transfer chamber 124. The exhaust part 127 is configured to return a portion of the atmosphere exhausted to the outside of the substrate transfer chamber 124 to the clean unit 134 for circulation, and to exhaust the remainder to the outside of the substrate processing apparatus 100. The exhaust part 127 will also be referred to as a substrate transfer chamber system exhaust part.

As illustrated in FIG. 2, the process furnace 202 is installed above the boat 217. The process furnace 202 includes a reaction tube 201 as described hereinbelow therein, and a heater 211 for heating the interior of the reaction tube 201 around the reaction tube 201. The lower end of the process furnace 202 is opened and closed by a furnace-opening cap 147. Details of the process furnace 202 will be described below.

As illustrated in FIG. 1, a boat elevator 115 for moving the boat 217 up and down is installed in the substrate transfer chamber 124. The boat elevator 115 constitutes a substrate support (boat) transfer machine as a substrate support transfer means. A seal cap 219 is horizontally installed at an arm 128 connected to the boat elevator 115, and is configured to vertically support the boat 217 and seal the lower end of the process furnace 202.

The boat 217 includes a plurality of holding members, and is configured to support a plurality of substrates 200, e.g., about 50 to 125 substrates, in a horizontal posture in such a state that the substrates 200 are arranged along the vertical direction with the centers of the substrates 200 aligned with one another.

In addition, the substrate processing apparatus 100 according to the present embodiments includes a controller 300 (which will be described below) as a control means. The controller 300 is configured to control the entire substrate processing apparatus 100, such as the gas flow rate control to the process furnace 202, the pressure control in the process furnace 202, the heater temperature control of the process furnace 202, the driving control of the boat elevator 115 and the substrate transfer mechanism 125, and the like, in the substrate processing apparatus 100.

Next, a reinforcement structure according to the present embodiments and its surrounding structure will be described with reference to FIGS. 3 to 7. Further, α and α' in FIGS. 3 to 6 indicate the direction of α and the direction of α' in FIG. 2.

The sub-housing 119 constitutes the substrate transfer chamber 124 as described above. In the present embodiments, the substrate transfer chamber 124 is adjacent to the process furnace 202. The substrate transfer chamber 124 is a substrate transfer chamber for transferring the substrates 200 between the boat 217 and the pods 110, and is also a transfer chamber used for loading the boat 217 mounting the substrates 200 into and out of a process chamber. The substrate transfer chamber 124 has a sealed space for preventing formation of a natural oxide film on the substrates 200, and has a structure filled with an inert gas, for example, a nitrogen ($N_2$) gas. Therefore, the sub-housing 119 is established to have an airtight structure which is kept at a positive pressure of about 50 Pa from the atmospheric pressure.

The substrate transfer chamber 124 has large volume for enclosing the boat 217, the clean air unit 134, the substrate transfer device 125a, and the like, but has a structure in which plates such as stainless steel or the like are combined to reduce its weight. Therefore, reinforcement structures 141 are installed at the wall of the substrate transfer chamber 124.

Figure 3:
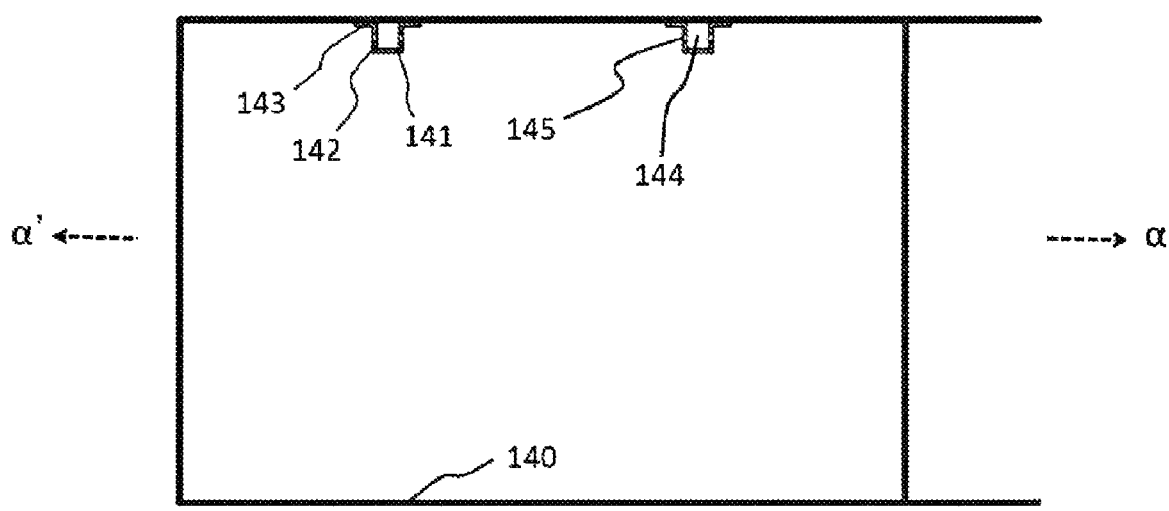
FIG. 3 is a view illustrating a reinforcement structure.
Figure 4:
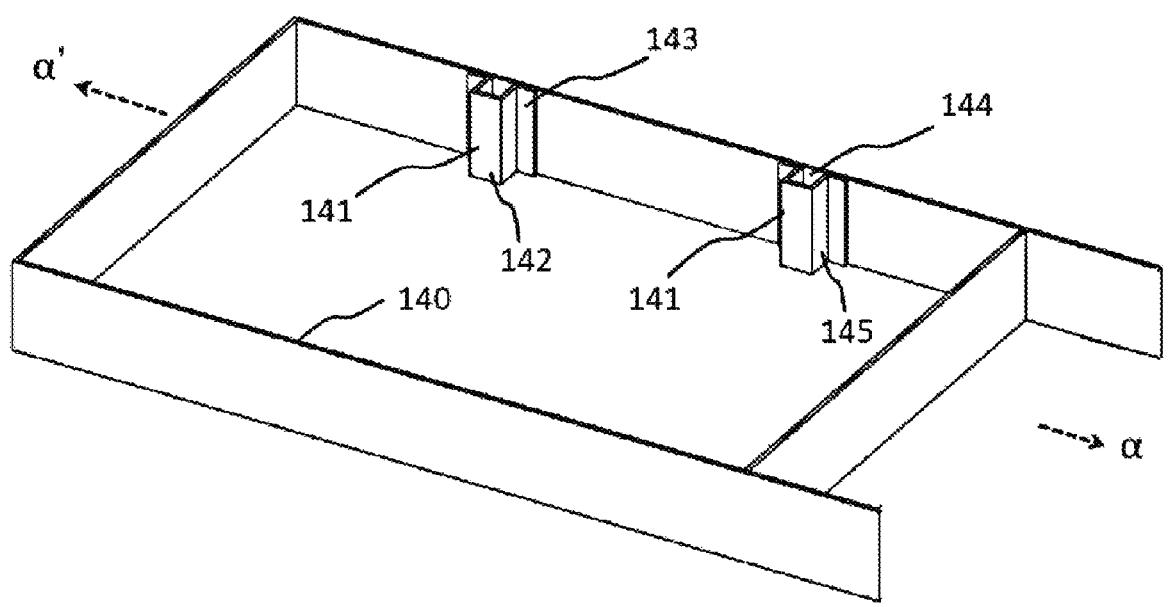
FIG. 4 is a view illustrating a reinforcement structure.
Figure 5:
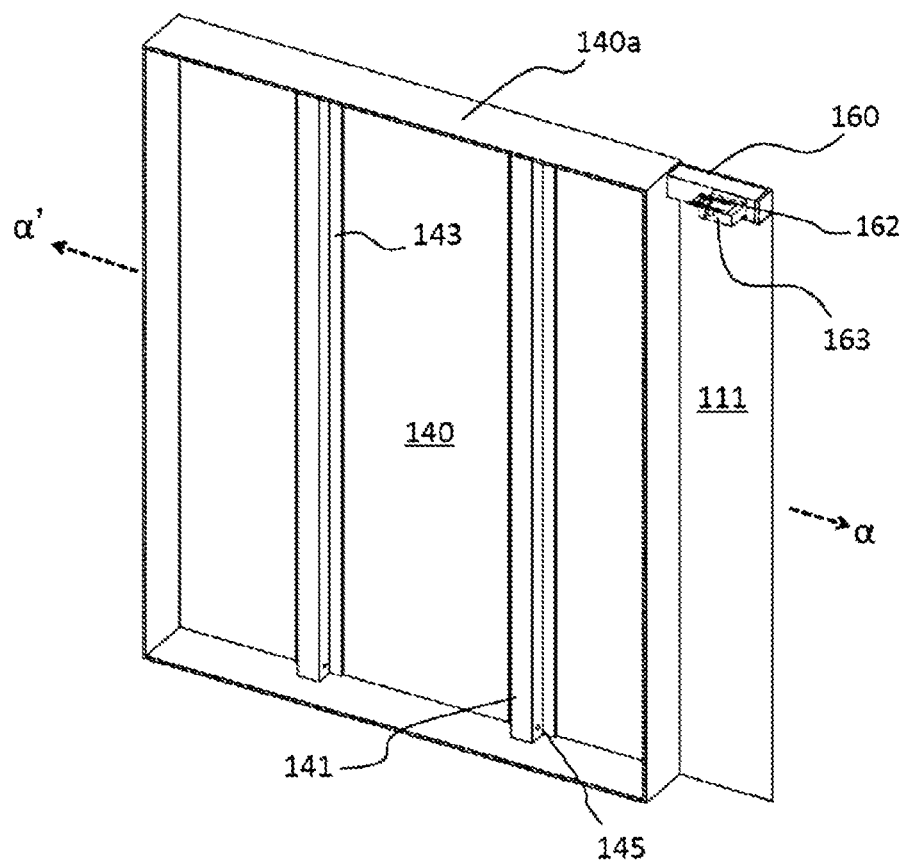
FIG. 5 is a view illustrating a reinforcement structure and a pressure regulator.
Figure 6:
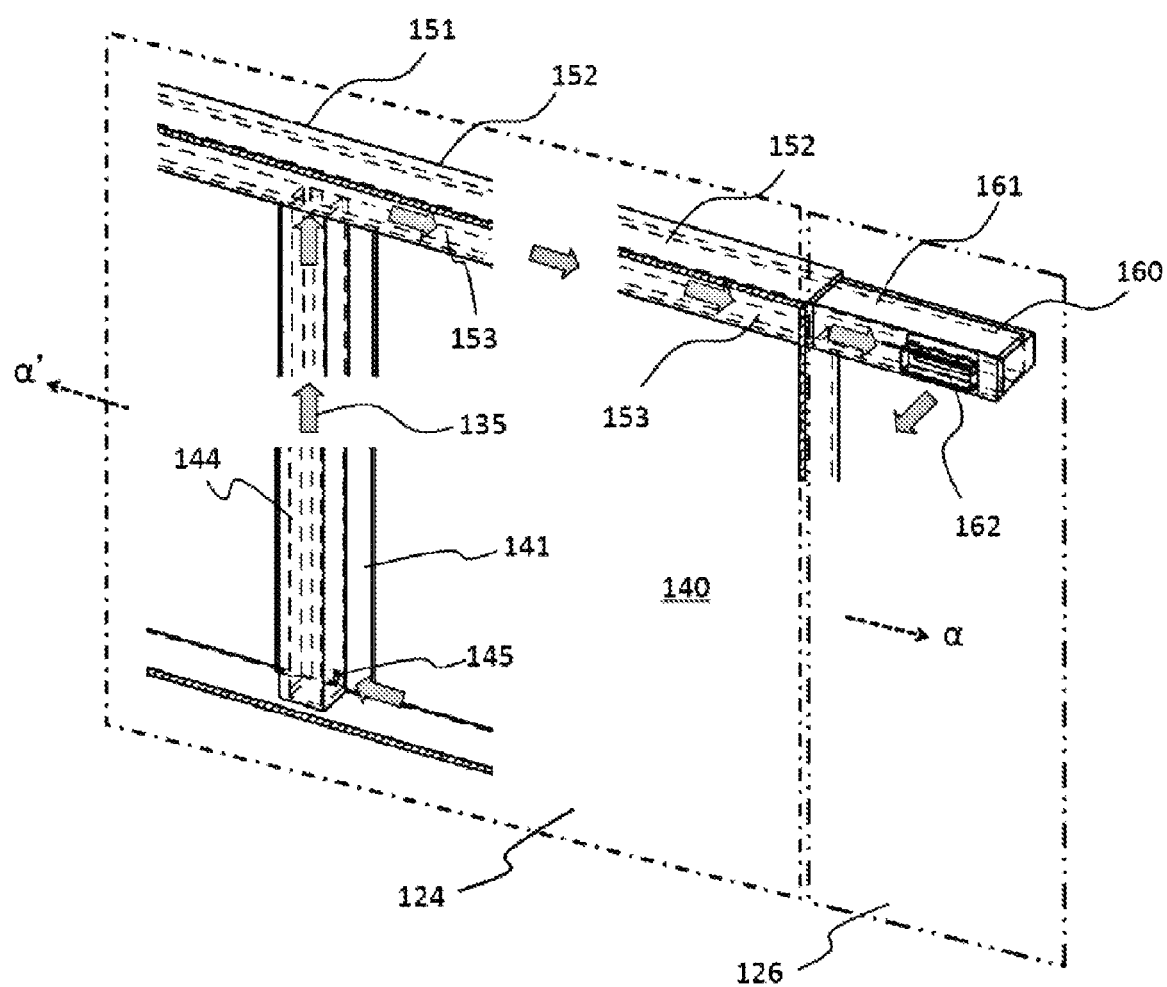
FIG. 6 is a view illustrating a reinforcement structure and a pressure regulator.

The reinforcement structures 141 will be described with reference to FIGS. 3, 4, 5, and 6. FIG. 3 is a cross sectional view taken along a dotted line α-α' in FIG. 2. The configuration of the clean air unit 134 and the like will be omitted for convenience of description. FIG. 4 is a view illustrating a cutting portion of FIG. 3 as a perspective view. FIGS. 5 and 6 are views illustrating an entire sidewall of the substrate transfer chamber 124 and its surrounding structure.

A plurality of reinforcement structures 141 are arranged along a wall 140 of the substrate transfer chamber 124. The position and number of arrangements are appropriately adjusted according to the strength of other components to be arranged and the substrate transfer chamber 124. In FIGS. 3 and 4, two reinforcement structures 141 are arranged along the wall 140 as an example. As illustrated in FIG. 5, the reinforcement structures 141 are arranged to extend in the vertical direction on the wall 140 at a lateral side of the substrate transfer chamber 124.

As illustrated in FIG. 6, a collecting pipe 151 is further installed above the reinforcement structure 141 at the substrate transfer chamber 124. The collecting pipe 151 is installed along an upper wall 140a in FIG. 5, and is arranged to extend in the horizontal direction. In FIG. 6, one reinforcement structure 141 is illustrated for convenience of description, but the collecting pipe 151 is also connected to the other reinforcement structure 141. With this arrangement, the strength of the substrate transfer chamber 124 is improved.

The reinforcement structure 141 has a U-shaped main structure 142 (which includes, for example side portions and a connection portion that is interposed between the side portions and arranged to be perpendicular to the side portions) and a flange 143 to maintain the strength. The reinforcement structure 141 is fixed to the wall 140 by welding the flange 143 to the wall 140. A confinement space 144 is formed between the main structure 142 and the wall 140. The confinement space 144 will also be referred to as a first confinement space. A communication hole 145 is formed at the main structure 142 to communicate the confinement space 144 with the internal space of the substrate transfer chamber 124.

The confinement space 144 communicates with a confinement space 153 in the collecting pipe 151. The collecting pipe 151 has, for example, a tubular structure 152 having a cavity therein. The cavity in the tubular structure 152 will be referred to as the confinement space 153, in which the confinement space 153 communicates with the confinement space 144. The confinement space 153 will also be referred to as a second confinement space. Also, as the reinforcement structure, a reinforcement structure using the same main structure and flange as those of the reinforcement structure 141 may be used.

Meanwhile, it is necessary to remove the oxygen components in the substrate transfer chamber 124 as described above. For example, it is desirable that the oxygen concentrations in the substrate transfer chamber 124 be 3 ppm or lower.

Most of the oxygen components are removed by the clean air 133 supplied from the clean unit 134. However, there is a problem that it is difficult to remove the oxygen components in the confinement spaces 144 and 153. This is because the confinement space 144 is covered with the main structure 142 and the confinement space 153 is covered with the tubular structure 152 to make it difficult for the clean air 133 to reach each space. Therefore, much time is required to reduce the oxygen components to a desired concentration or lower.

Furthermore, as another method of reducing the oxygen concentration, it may also be considered that the space between the confinement space 144 and the substrate transfer chamber 124 and the space between the confinement space 153 and the substrate transfer chamber 124 are completely isolated from each other. However, since the flange 143 is only welded to the wall 140, there is a problem that oxygen enters the substrate transfer chamber 124 from each confinement space via the welded portion, and as a result, the oxygen concentration in the substrate transfer chamber 124 is increased. Therefore, it is difficult to lower the oxygen concentration even if the isolation is attempted by welding.

In addition, a method of communicating the confinement space 144 with a pump may be considered as in the related art. However, although the oxygen component concentration may be early reduced to a desired value or lower, the internal atmosphere of the substrate transfer chamber 124 may also be quickly exhausted by the pump through the confinement space 144, making it difficult to regulate the pressure of the substrate transfer chamber 124. Furthermore, there is a problem that the clean air 133 may be discharged and unnecessarily wasted.

Therefore, in the present technique, as illustrated in FIGS. 5 and 6, a pressure regulator 160 for controlling the pressures of the confinement space 144 and the confinement space 153 is installed. Details thereof will be described below.

As illustrated in FIGS. 5 and 6, the communication hole 145 is formed at a lower side of the reinforcement structure 141. The upper end of the reinforcement structure 141 is connected to the collecting pipe 151, and the confinement space 144 and the confinement space 153 communicate with each other. As will be described below, the inert gas in the substrate transfer chamber 124 is moved from the substrate transfer chamber to the pod transfer chamber 126 via the reinforcement structure 141, the collecting pipe 151, and the pressure regulator 160. That is, the communication hole 145 is formed at the upstream side of the inert gas flow in the reinforcement structure 141.

The collecting pipe 151 extends toward the pod transfer chamber 126 along the upper wall 140a. The pressure regulator 160 is installed at the pod transfer chamber 126, and the collecting pipe 151 is connected to the pressure regulator 160. Thus, the confinement space 153 and a buffer space 161 in the pressure regulator 160 communicate with each other. A communication hole 162 is formed at the pressure regulator 160.

Figure 7:
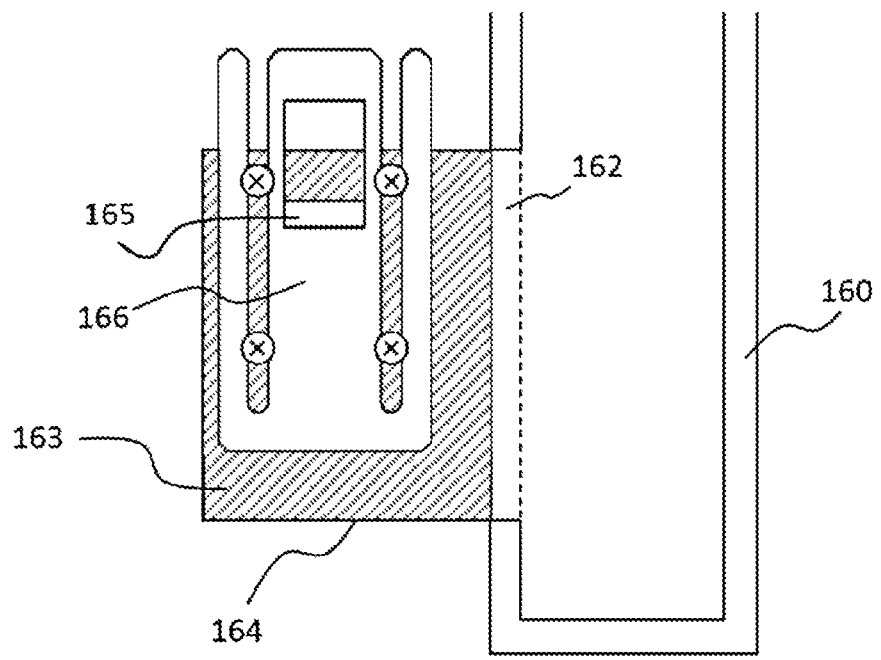
FIG. 7 is a view illustrating a pressure regulator.

As illustrated in FIGS. 5 and 7, a pressure regulation structure 163 is installed at the pressure regulator 160. The pressure regulation structure 163 is a box-shaped structure having a space therein. The internal space of the pressure regulation structure 163 communicates with the buffer space 161 via the communication hole 162.

A hole 165 is formed at the pressure regulation structure 163 to allow the internal space of the pressure regulation structure 163 to communicate with the atmosphere of the pod transfer chamber 126. A slide type lid 166 is installed near the hole 165 so that the degree of opening of the hole 165 can be controlled.

By controlling the opening degree of the hole 165, the pressure is regulated to gradually decrease toward the downstream, such as in the following way: "pressure of the substrate transfer chamber 124>pressure of the confinement space 144>pressure of the confinement space 153>pressure of the pod transfer chamber 126." Since it is configured to cope with without directly connecting a device for rapidly reducing the pressure, such as the pump, it is possible to realize a gentle pressure gradient. Therefore, the pressures of the first confinement space and the second confinement space can be kept at predetermined values. Thus, the pressure regulation of the substrate transfer chamber 124 communicating with them is facilitated.

In addition, since it is configured to communicate with the atmosphere of the pod transfer chamber 126, the oxygen components in each confinement space are exhausted from the exhaust part 132. That is, the exhaust process can be completed in the substrate processing apparatus 100. Since the atmosphere of the substrate transfer chamber 124 is not exhausted to the outside of the substrate processing apparatus 100, it is possible to more reliably secure the safety of a person staying around the substrate processing apparatus 100.

(Process Furnace)

Next, details of the process furnace 202 described above will be described with reference to FIG. 8.

FIG. 8 is a vertical cross sectional view illustrating a configuration example of the process furnace used in the substrate processing apparatus.

The process furnace 202 includes a reaction tube 201. The reaction tube 201 is made of a heat resistant non-metallic material such as, e.g., quartz ($SiO_2$) or silicon carbide (SiC), and has a cylindrical shape with its upper end closed and its lower end opened. The lower end thereof is supported by a manifold 205. A space formed inside the reaction tube 201 and the manifold 205 will be referred to as a process space 203. The reaction tube 201 and the manifold 205 will be generally referred to as the process chamber.

A furnace opening is formed at the manifold 205. The furnace opening is an entrance through which the boat 217 passes when it is inserted into the process space 203. The manifold, the furnace opening, and the like will be generally referred to as a furnace opening part.

It is configured so that the substrates 200 supported by the boat 217 in a horizontal posture are accommodated in the process space 203 to be arranged along a vertical direction and in multiple stages. The boat 217 accommodated in the process space 203 is configured to be rotatable by rotating a rotary shaft 206 by a rotation mechanism 204, with the plurality of substrates 200 mounted thereon, while maintaining hermeticity in the process space 203.

The manifold 205 is disposed below the reaction tube 201 in a concentric relationship with the reaction tube 201. The manifold 205 is made of a metal material, e.g., stainless steel or the like, and has a cylindrical shape with its upper and lower ends opened. The reaction tube 201 is vertically supported by the manifold 205 from the lower end side. That is, the reaction tube 201 forming the process space 203 is vertically erected via the manifold 205 so as to constitute the process furnace 202.

The furnace opening is configured to be hermetically sealed by the seal cap 219 when the boat elevator (not shown) is raised. A seal member 207 such as an O-ring or the like for hermetically sealing the interior of the process space 203 is installed between the lower end of the manifold 205 and the seal cap 219.

Furthermore, a gas introduction pipe 208 for introducing a processing gas, a purge gas, or the like into the process space 203 and an exhaust part 210 for exhausting a gas in the process space 203 are connected to the manifold 205. The exhaust part 210 includes an exhaust pipe 210a and an APC (auto pressure controller) 210b. The exhaust part 210 will also be referred to as a process chamber system exhaust part.

The gas introduction pipe 208 is a nozzle. A plurality of gas supply holes are formed at the downstream side of the gas introduction pipe 208, and it is configured so that the interior of the gas introduction pipe 208 communicates with the reaction tube 201. The processing gas or the like is supplied from the gas supply holes to the process space 203.

For example, two gas introduction pipes 208 are installed. In this case, one of them is a first gas introduction pipe 208a for supplying a precursor gas, and the other pipe is a second gas introduction pipe 208b for supplying a reaction gas reacting with the precursor gas. Although the two supply pipes are described herein, the number of supply pipes is not limited thereto but may be three or more depending on the type of process.

The gas introduction pipes 208 are connected to a processing gas transfer pipe 209 at the upstream side. The processing gas transfer pipe 209 is configured to transfer a gas from a gas source or the like to the gas introduction pipes 208. A first processing gas transfer pipe 209a is connected to the first gas introduction pipe 208a, and a second processing gas transfer pipe 209b is connected to the second gas introduction pipe 208b. The connection between the gas introduction pipe 208 and the processing gas transfer pipe 209 will be described below.

An inert gas transfer pipe 213 is connected to the processing gas transfer pipe 209. The inert gas transfer pipe 213 is configured to supply an inert gas to the processing gas transfer pipe 209. The inert gas is, for example, a nitrogen ($N_2$) gas, and acts as a carrier gas for the processing gas or as a purge gas for the reaction tube 201, the gas introduction pipe 208, and the processing gas transfer pipe 209.

A first inert gas transfer pipe 213a is connected to the first processing gas transfer pipe 209a, and a second inert gas transfer pipe 213b is connected to the second processing gas transfer pipe 209b.

A mass flow controller 231 for controlling the supply amount of the processing gas and a valve 232 are installed at the first processing gas transfer pipe 209. A mass flow controller 231a and a valve 232a are installed at the first processing gas transfer pipe 209a. A mass flow controller 231b and a valve 232b are installed at the processing gas transfer pipe 209b. The processing gas transfer pipe 209, the processing gas transfer pipe 209b, the mass flow controller 231, and the valve 232 will be generally referred to as a processing gas supply part.

A mass flow controller 233 for controlling the supply amount of the inert gas and a valve 234 are installed at the inert gas transfer pipe 213. A mass flow controller 233a and a valve 234a are installed at the first inert gas introduction pipe 213a. A mass flow controller 233b and a valve 234b are installed at the second inert gas introduction pipe 213b. The inert gas transfer pipe 213, the mass flow controller 231, and the valve 234 will be generally referred to as a process chamber system inert gas supply part.

The processing gas supply part and the process chamber system inert gas supply part will be generally referred to as a process chamber system gas supply part.

The heater 211 as a heating means (heating mechanism) is disposed at the outer periphery of the reaction tube 201 to be concentric with the reaction tube 201. The heater 211 is configured to heat the internal atmosphere of the process space 203 such that the interior of the process space 203 has a uniform or predetermined temperature distribution over the whole.

Next, the controller 300 for controlling operations of the respective parts described above will be described with reference to FIG. 9. The controller 300 is configured to control the overall operation of the substrate processing apparatus 100. For example, the respective components of the substrate processing apparatus such as the transfer chamber system inert gas supply part, the transfer chamber system exhaust part, the substrate transfer chamber system inert gas supply part, the substrate transfer chamber system exhaust part, the process chamber system gas supply part, the process chamber system exhaust part, and the like are controlled by the controller 300.

FIG. 9 is a block diagram schematically illustrating a configuration example of the controller of the substrate processing apparatus. The controller 300 may be configured as a computer including a CPU (central processing unit) 301, a RAM (random access memory) 302, a memory device 303, and an I/O port 304. The RAM 302, the memory device 303, and the I/O port 304 are configured to exchange data with the CPU 301 via an internal bus 305. An input/output device 313 formed of, e.g., a touch panel or the like, and an external memory device 314 are configured to be connected to the controller 300. Information may be input to the controller 300 from the input/output device 313. Furthermore, the input/output device 313 is configured to display and output information under the control of the controller 300. In addition, a network 312 is configured to be connected to the controller 300 via a receiving part 311. This means that the controller 300 can also be connected to a higher device 320 such as a host computer or the like existing on the network 312.

The memory device 303 is configured by, for example, a flash memory, a HDD (hard disk drive), or the like. A control program for controlling operations of the substrate processing apparatus 100, a process recipe for specifying sequences and conditions of substrate processing, operation data or processing data generated during a process for setting the process recipe used for processing the substrates 200 is set, or the like is readably stored in the memory device 303. The process recipe functions as a program for causing the controller 300 to execute each sequence in the substrate-processing process to obtain a predetermined result. Hereinafter, the process recipe and the control program will be generally and simply referred to as a "program." Furthermore, when the term "program" is used herein, it may indicate a case of including only the process recipe, a case of including only the control program, or a case of including both the process recipe and the control program. The RAM 302 is configured as a memory area (work area) in which a program, operation data, or processing data read by the CPU 301 is temporarily stored.

The CPU 301 as an operation part is configured to read the control program from the memory device 303 and execute the same. The CPU 121a is also configured to read the process recipe from the memory device 303 according to an input of an operation command from the input/output device 313. The CPU 301 is also configured to calculate operation data by comparing and operating a set value input from the receiving part 311 and the process recipe or control data stored in the memory device 303. Furthermore, the CPU 301 is configured to execute a process of determining corresponding processing data (process recipe) from the operation data, and the like. In addition, the CPU 301 is configured to control, according to the contents of the process recipe thus read, the operations of the respective parts of the substrate processing apparatus 100.

The controller 300 is not limited to a case of being configured as a dedicated computer, but may be configured as a general-purpose computer. For example, the controller 300 according to the present embodiments may be configured by installing, on the general-purpose computer, the aforementioned program stored in the external memory device 314 (for example, a magnetic tape, a magnetic disk such as a flexible disk or a hard disk, an optical disc such as a CD or DVD, a magneto-optical disc such as a MO, or a semiconductor memory such as a USB memory or a memory card). However, means for supplying the program to the computer is not limited to the case of supplying it via the external memory device 314. For example, the program may be supplied to the computer using a communication means such as the network 312 (the Internet or a dedicated line), instead of using the external memory device 314. The memory device 303 or the external memory device 314 is configured as a non-transitory computer-readable recording medium. Hereinafter, the memory device 303 and the external memory device 314 will be generally and simply referred to as a "recording medium." When the term "recording medium" is used herein, it may indicate a case of including only the memory device 303, a case of including only the external memory device 314, or a case of including both the memory device 303 and the external memory device 314.

Next, an operation of the substrate processing apparatus 100 according to the present embodiments will be described. This operation is mainly controlled by the controller 300.

The pod 110 is held on the mounting table 122. The substrate-loading/unloading port 120 of the pod opener 121 is closed by the cap-attaching/detaching mechanism 123.

When the substrate transfer chamber 124 is in a clean air atmosphere in advance by adjusting the lid 166 to adjust the opening degree of the hole 165, it is set such that the relationship of "pressure of the substrate transfer chamber 124>pressure of the confinement space 144>pressure of the confinement space 153>pressure of the pod transfer chamber 126" is satisfied.

First, the clean air unit 131 and the exhaust part 132 are activated to supply clean air from the clean air unit 134 in a state in which there is no substrate 200 mounted on the boat 217. Subsequently, the substrate transfer chamber 124 is set to the atmosphere of the clean air 133 by supplying the clean air 133 from the clean air unit 134 into the substrate transfer chamber 124.

At this time, the exhaust part 127 is stopped. By stopping the exhaust part 127, it is possible to easily achieve the relationship of "pressure of the substrate transfer chamber 124>pressure of the confinement space 144>pressure of the confinement space 153>pressure of the pod transfer chamber 126".

Therefore, the clean air supplied to the confinement space 144 is moved to the pod transfer chamber 126 via the substrate transfer chamber 124, the reinforcement structure 141, the collecting pipe 151, and the pressure regulator 160, as illustrated by an arrow 135 in FIG. 6. That is, the oxygen components in the confinement space 144 and the confinement space 153 are transferred to the pod transfer chamber 126. In this manner, the residual oxygen in the confinement space 144 and the confinement space 153 is exhausted.

The oxygen components exhausted to the pod transfer chamber 126 are exhausted from the exhaust part 132 of the pod transfer chamber 126. When the oxygen components are exhausted from the confinement space 144 and the confinement space 153 and reach a predetermined concentration, the exhaust part 127 is activated to adjust the pressure of the substrate transfer chamber 124.

Since the opening degree of the hole 165 is continuously maintained at this time, the reinforcement structure 141 and the collecting pipe 151 are filled with the clean air so that the predetermined pressure is kept. Thus, it is possible to easily regulate the pressure of the substrate transfer chamber 124 in a short time.

However, if the exhaust part 127 is operated while the oxygen components are being removed, the following problem may occur. When the exhaust part 127 is operated, the substrate transfer chamber 124 has a low pressure, and the oxygen components in the pod transfer chamber 126 may be moved to the substrate transfer chamber 124. They may diffuse into the substrate transfer chamber 124, making it impossible to remove the oxygen components. Therefore, it is desirable to stop the exhaust part 127.

However, the exhaust part 127 may be operated as long as the relationship of "pressure of the substrate transfer chamber 124>pressure of the confinement space 144>pressure of the confinement space 153>pressure of the pod transfer chamber 126" can be satisfied. When the exhaust part 127 is operated, there is an effect that the oxygen components in the substrate transfer chamber 124 can be early removed.

Furthermore, the exhaust part 127 may be stopped when some oxygen components are removed from the substrate transfer chamber 124 by operating the exhaust part 127 firstly. Specifically, the oxygen components in the substrate transfer chamber 124 are removed from the substrate transfer chamber exhaust part while operating the exhaust part 127, and after lapse of a predetermined time, the exhaust part 127 is stopped, and the residual oxygen in each space is exhausted from the confinement space 144 and the confinement space 153 to the pod transfer chamber 126. By doing so, it is possible to early remove the oxygen components, and also to reliably remove the oxygen components from the confinement space.

Next, as illustrated in FIG. 2, the cap of the pod 110 held on the mounting table 122 is separated by the cap-attaching/detaching mechanism 123, and the substrate-loading/unloading port of the pod 110 is opened. Furthermore, the substrate 200 is picked up from the pod 110 by the substrate transfer device 125a and is transferred to the boat 217 to be charged thereon. The substrate transfer device 125a, which has transferred the substrate 200 to the boat 217, is returned to the pod 110 and charges a next substrate 200 on the boat 217.

During the charging operation of the substrate 200 on the boat 217 by the substrate transfer device 125a at the one (upper or lower) pod opener 121, another pod 110 is transferred from the rotary shelf 105 and the load port 114 to the other (lower or upper) pod opener 121 by the pod transfer device 118, and the opening operation of the pod 110 by the pod opener 121 is simultaneously performed.

When a predetermined number of substrates 200 are charged on the boat 217, the lower end of the process furnace 202 is opened by the furnace-opening cap 147. Subsequently, the seal cap 219 is raised by the boat elevator 115, and the boat 217 supported by the seal cap 219 is loaded into the reaction tube 201 in the process furnace 202.

After the boat loading, the substrate processing as described hereinbelow is performed on the substrates 200 in the reaction tube 201. After the processing, the boat 217 is unloaded from the reaction tube 201 by the boat elevator 115, and the substrates 200 and the pods 110 are subsequently discharged to the outside of the housing 111 in reverse order.

Next, the substrate processing performed in the process furnace 202 will be described. Furthermore, the substrate processing according to the present embodiments is a method of forming a film on the surface of each of the substrates 200 by using, for example, a CVD (chemical vapor deposition) method, and is performed as one of the processes for manufacturing a semiconductor device.

A substrate-loading step S10 will be described. First, the boat 217 supporting the plurality of substrates 200 as described above is lifted up by the boat elevator 115 and is loaded into the process space 203 (boat loading). In this state, the seal cap 219 seals the lower end of the manifold 205 via the O-ring 207.

Next, a pressure-dropping/pressure-rising step S20 will be described. The internal atmosphere of the process space 203 is exhausted from the exhaust part 210 so that the interior of the process space 203 has a desired pressure (degree of vacuum). The exhaust part 210 will also be referred to as a process chamber exhaust part. In this operation, the internal pressure of the process space 203 is measured, and the degree of opening of the APC valve 210b installed at the exhaust part 210 is feedback-controlled based on the measured pressure. Furthermore, the interior of the process space 203 is heated by the heater 211 to a desired temperature. In this operation, a state of supplying electric power to the heater 211 is feedback-controlled based on temperature information detected by a temperature sensor such that the interior of the process space 203 has a desired temperature distribution. In addition, the substrates 200 are rotated by rotating the boat 217 by the rotation mechanism 204.

Next, a film-forming step S30 will be described. At the film-forming step, a desired film is formed on the substrates 200 by supplying a gas thereto.

In the present embodiments, an example in which a hexachlorodisilane ($Si_2Cl_6$, also referred to as HCDS) is used as a first processing gas supplied from the first gas introduction pipe 208a, and an ammonia ($NH_3$) gas is used as a second processing gas supplied from the second gas introduction pipe 208b will be described.

The HCDS gas is supplied to the process space 203 via the first processing gas transfer pipe 209a and the first gas introduction pipe 208a. Furthermore, the $NH_3$ gas is supplied to the process space 203 via the second processing gas transfer pipe 209b and the second gas introduction pipe 208b.

The HCDS gas and the $NH_3$ gas supplied to the process space 203 react with each other to form a silicon nitride film on the substrate 200.

Next, a pressure-rising step S40 will be described. When the film-forming step S30 is completed, a purge gas is supplied into the process space 203 until the internal pressure of the process space 203 reaches an atmospheric pressure by reducing the opening degree of the APC valve 210b. The purge gas is, e.g., a $N_2$ gas, and is supplied to the process space via the inert gas transfer pipes 213a and 213.

Next, a substrate-unloading step S50 will be described. The film-formed substrate 200 is unloaded from the process space 203 in reverse order of the substrate-loading step S10.

Second Embodiments

Next, second embodiments will be described. The second embodiments differ from the first embodiments in the structure of the pressure regulation structure. Other components are similar to those of the first embodiments. Differences will be mainly described below.

Figure 10:
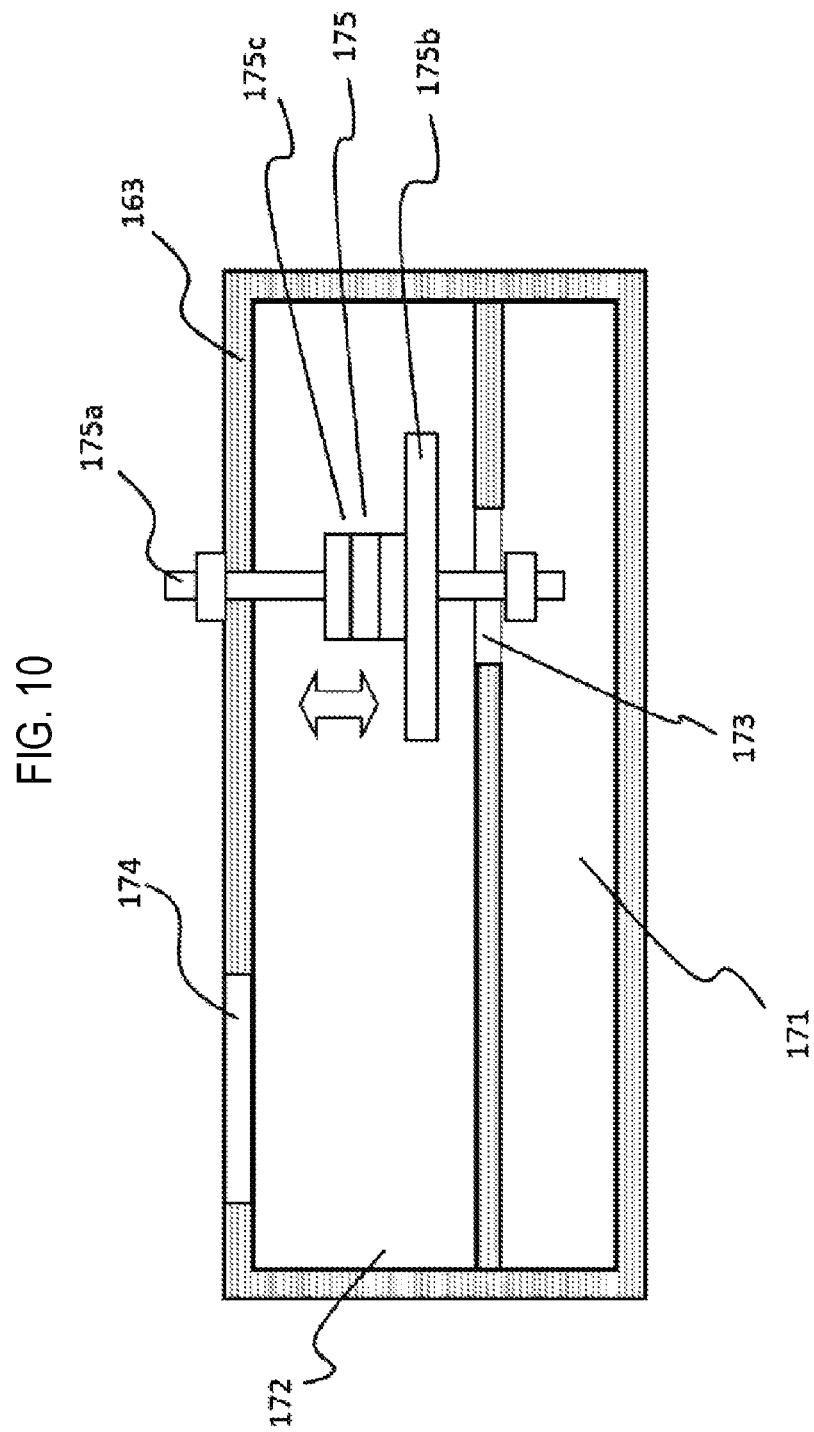
FIG. 10 is a view illustrating a pressure regulator.

The pressure regulator 160 of the present embodiments will be described with reference to FIG. 10. The pressure regulator 160 of the present embodiments includes a lower buffer space 171 communicating with the collecting pipe 151. An upper buffer space 172 is installed on the lower buffer space 171. A hole 173 is formed between the lower buffer space 171 and the upper buffer space 172, through which they communicate. Furthermore, a hole 174 is formed at the upper buffer space 172. The upper buffer space communicates with the pod transfer chamber 126 via the hole 174.

A pressure regulation device 175 is installed at the hole 173. The pressure regulation device 175 includes a shaft 175a, a valve body 175b, and a weight 175c. It is configured so that the shaft 175a is slidably supported and the valve body 175b opens and closes the hole 173. The weight of the valve body 175b may be increased or decreased by changing the number and weight of weights 175c. This pressure regulation device 175 can regulate the internal pressure of the lower buffer space 171 to a pressure corresponding to a weight preset in the valve body 175b by self-control (self-alignment).

Since the opening degree of the hole 173 can be adjusted by the pressure regulation device 175, pressures can be set to the following way: "pressure of the substrate transfer chamber 124>pressure of the confinement space 144>pressure of the confinement space 153>pressure of the pod transfer chamber 126" and it can be adjusted so that the pressure is reduced stepwise toward the downstream. Since it is configured here to cope with without directly connecting a device for rapidly reducing the pressure, such as the pump, it is possible to realize a gentle pressure gradient. Therefore, it is possible to keep the internal pressures of the first confinement space and the second confinement space at predetermined values. Thus, the pressure regulation of the substrate transfer chamber 124 communicating with them is facilitated.

According to the present disclosure in some embodiments, it is possible to realize a reduction in oxygen concentration in a housing and stable pressure control of a substrate transfer chamber.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
    a process chamber in which a substrate mounted on a boat is processed;
    a substrate transfer chamber configured to transfer the substrate to the boat;
    a pod transfer chamber adjacent to the substrate transfer chamber;
    a transfer chamber system exhaust part installed at the pod transfer chamber, and configured to actively exhaust an internal atmosphere of the pod transfer chamber;
    a plurality of reinforcement structures, which are U-shaped beams, installed along a wall of a housing, which constitutes the substrate transfer chamber, whereby a confinement space is formed between each of the plurality of reinforcement structures and the wall;
    a communication hole installed at each of the plurality of reinforcement structures so that a space in the housing and the first confinement space communicate with each other;
    a collecting pipe connected to the plurality of reinforcement structures in the housing and including a second confinement space that communicates with the first confinement space and extends toward the pod transfer chamber;
    an inert gas supply part comprising a fan and a dustproof filter configured to supply an inert gas into the housing constituting the substrate transfer chamber; and
    a pressure regulator connected to the second confinement space of the collecting pipe at the pod transfer chamber,
    wherein the transfer chamber system exhaust part is activated to exhaust the internal atmosphere of the pod transfer chamber, and thereby the inert gas flows sequentially via the first confinement space, the second confinement space, the pressure regulator, and the pod transfer chamber, and
    wherein the pressure regulator is configured to control pressures of the first confinement space and the second confinement space such that a relationship of (pressure of the substrate transfer chamber)>(pressure of the first confinement space)>(pressure of the second confinement space)>(pressure of the pod transfer chamber) is satisfied,
    wherein the pressure regulator includes a pressure regulation structure communicating with the pod transfer chamber, the pressure regulation structure including:
        a box-shaped structure comprising an internal space;
        a hole installed at the box-shaped structure; and
        a lid configured to adjust a degree of opening of the hole.

2. The apparatus according to claim 1, wherein each of the plurality of reinforcement structures includes a flange, and each of the plurality of reinforcement structures is fixed to the wall by welding the flange to the wall.

3. The apparatus according to claim 2, wherein the communication hole is installed at an upstream side of each of the plurality of reinforcement structures with respect to a flow of the inert gas.

4. The apparatus according to claim 3, wherein a substrate transfer chamber system exhaust part is installed at the substrate transfer chamber, and configured to actively exhaust an internal atmosphere of the substrate transfer chamber, and
    wherein the substrate transfer chamber system exhaust part is configured to stop an operation to exhaust an internal atmosphere from the substrate transfer chamber while the inert gas supply part supplies the inert gas to the housing in a state in which there is no substrate at the substrate transfer chamber.

5. The apparatus according to claim 3, wherein a substrate transfer chamber system exhaust part is installed at the substrate transfer chamber, and configured to actively exhaust an internal atmosphere of the substrate transfer chamber,
    wherein the substrate transfer chamber system exhaust part is configured to perform an operation to exhaust an atmosphere from the substrate transfer chamber while the inert gas supply part supplies the inert gas to the housing in a state in which there is no substrate at the substrate transfer chamber, and
    wherein after lapse of a predetermined time, the substrate transfer chamber system exhaust part is configured to stop the operation while the inert gas supply part supplies the inert gas.

6. The apparatus according to claim 2, wherein a substrate transfer chamber system exhaust part is installed at the substrate transfer chamber, and configured to actively exhaust an internal atmosphere of the substrate transfer chamber, and
    wherein the substrate transfer chamber system exhaust part is configured to stop an operation to exhaust an internal atmosphere from the substrate transfer chamber while the inert gas supply part supplies the inert gas to the housing in a state in which there is no substrate at the substrate transfer chamber.

7. The apparatus according to claim 2, wherein a substrate transfer chamber system exhaust part is installed at the substrate transfer chamber, and configured to actively exhaust an internal atmosphere of the substrate transfer chamber,
  wherein the substrate transfer chamber system exhaust part is configured to perform an operation to exhaust an atmosphere from the substrate transfer chamber while the inert gas supply part supplies the inert gas to the housing in a state in which there is no substrate at the substrate transfer chamber, and
  wherein after lapse of a predetermined time, the substrate transfer chamber system exhaust part is configured to stop the operation while the inert gas supply part supplies the inert gas.

8. The apparatus according to claim 1, wherein the communication hole is installed at an upstream side of each of the plurality of reinforcement structures with respect to a flow of the inert gas.

9. The apparatus according to claim 8, wherein a substrate transfer chamber system exhaust part is installed at the substrate transfer chamber, and configured to exhaust an internal atmosphere of the substrate transfer chamber, and
  wherein the substrate transfer chamber system exhaust part is configured to stop an operation to exhaust an internal atmosphere from the substrate transfer chamber while the inert gas supply part supplies the inert gas to the housing in a state in which there is no substrate at the substrate transfer chamber.

10. The apparatus according to claim 8, wherein a substrate transfer chamber system exhaust part is installed at the substrate transfer chamber, and configured to exhaust an internal atmosphere of the substrate transfer chamber, and
  wherein the substrate transfer chamber system exhaust part is configured to perform an operation to exhaust an atmosphere from the substrate transfer chamber while the inert gas supply part supplies the inert gas to the housing in a state in which there is no substrate at the substrate transfer chamber, and
  wherein after lapse of a predetermined time, the substrate transfer chamber system exhaust part is configured to stop the operation while the inert gas supply part supplies the inert gas.

11. The apparatus according to claim 1, wherein a substrate transfer chamber system exhaust part is installed at the substrate transfer chamber, and configured to actively exhaust an internal atmosphere of the substrate transfer chamber, and
  wherein the substrate transfer chamber system exhaust part is configured to stop an operation to exhaust an internal atmosphere from the substrate transfer chamber while the inert gas supply part supplies the inert gas to the housing in a state in which there is no substrate at the substrate transfer chamber.

12. The apparatus according to claim 1, wherein a substrate transfer chamber system exhaust part is installed at the substrate transfer chamber, and configured to actively exhaust an internal atmosphere of the substrate transfer chamber,
  wherein the substrate transfer chamber system exhaust part is configured to perform an operation to exhaust an atmosphere from the substrate transfer chamber while the inert gas supply part supplies the inert gas to the housing in a state in which there is no substrate at the substrate transfer chamber, and
  wherein after lapse of a predetermined time, the substrate transfer chamber system exhaust part is configured to stop the operation while the inert gas supply part supplies the inert gas.

* * * * *